(12) United States Patent
Chen et al.

(10) Patent No.: US 7,579,616 B2
(45) Date of Patent: Aug. 25, 2009

(54) FOUR-TERMINAL PROGRAMMABLE VIA-CONTAINING STRUCTURE AND METHOD OF FABRICATING SAME

(75) Inventors: Kuan-Neng Chen, White Plains, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/733,523

(22) Filed: Apr. 10, 2007

(65) Prior Publication Data

US 2008/0251778 A1  Oct. 16, 2008

(51) Int. Cl.
*H01L 47/02* (2006.01)
(52) U.S. Cl. .......... 257/8; 257/2; 257/48; 257/797; 257/E31.029; 438/102; 438/900
(58) Field of Classification Search ............ 257/1–8, 257/48, 797, E31.029; 438/102, 900
See application file for complete search history.

(56) References Cited

U.S. PATENT DOCUMENTS

| | | |
|---|---|---|
| 6,839,263 B2 | 1/2005 | Fricke et al. |
| 7,009,694 B2 | 3/2006 | Hart et al. |
| 2006/0249724 A1 | 11/2006 | Krusin-Elbaum et al. |
| 2006/0274574 A1 | 12/2006 | Choi et al. |
| 2006/0279978 A1 | 12/2006 | Krusin-Elbaum et al. |
| 2006/0284160 A1 | 12/2006 | Khouri et al. |
| 2007/0020797 A1 | 1/2007 | Pellizzer et al. |
| 2007/0051936 A1 | 3/2007 | Pellizzer et al. |
| 2008/0206922 A1* | 8/2008 | Oliva et al. ............. 438/102 |

* cited by examiner

*Primary Examiner*—Evan Pert
*Assistant Examiner*—Scott R Wilson
(74) *Attorney, Agent, or Firm*—Scully, Scott, Murphy & Presser, P.C.; Paul Zucco

(57) ABSTRACT

A semiconductor structure that includes two programmable vias each of which contains a phase change material that is integrated with a heating material. In particular, the present invention provides a structure in which two programmable vias, each containing a phase change material, are located on opposing surfaces of a heating material. Each end portion of an upper surface of the heating material is connected to a metal terminal. These metal terminals, which are in contact with the end portions of the upper surface of the heating material, can be each connected to an outside component that controls and switches the resistance states of the two programmable vias. The two programmable vias of the inventive structure are each connected to another metal terminal. These metal terminals that are associated with the programmable vias can be also connected to a circuit block that may be present in the structure.

20 Claims, 14 Drawing Sheets

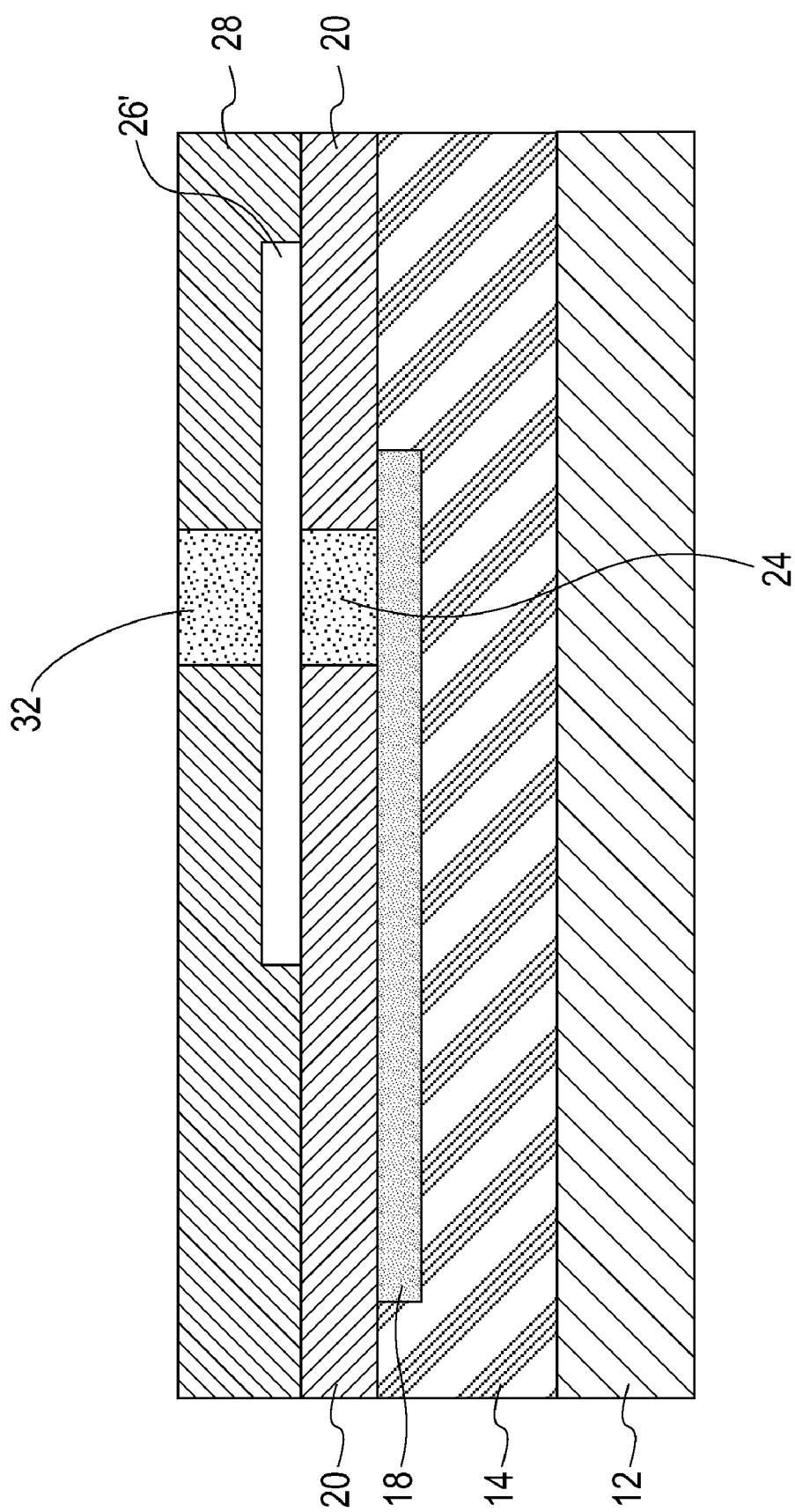

FOUR-TERMINAL PROGRAMMABLE VIA-CONTAINING STRUCTURE AND METHOD OF FABRICATING SAME

FIELD OF THE INVENTION

The present invention relates to a semiconductor structure and a method of fabricating the same. More particularly, the present invention relates to a semiconductor structure including at least two programmable vias that are both integrated with a heating material. The inventive structure provides a fast and reliable logic switching property medium as well as enabling the creation of a four-terminal structure that can control and switch the signals from an outside power source.

BACKGROUND OF THE INVENTION

Reconfigurable circuits have been widely used in the semiconductor industry for field programmable gate arrays (FPGAs) and for repair of a defective memory element. The FPGA consists of a set of simple, configurable logic blocks in an array with interspersed switches that can rearrange the interconnection between the logic blocks.

Reconfigurable circuits are also expected to play a significant role in three-dimensional (3D) integration technology that is presently being developed. Three-dimensional integration fabricates multilayer structures which are vertically stacked one upon another that can form a single chip combination with different functionalities. In these multilayered and multifunctional structures, reconfigurable circuit connection is typically needed to provide controllable logic functionality, memory repair, data encryption as well as other functions.

Phase change material based on programmable vias propose to offer advantages such as, for example, spatial compactness, no need for latches, multiple-shot reprogrammability, and immunity from soft errors, with no significant requirement of high switching voltage or high switching power, both in FGPA and 3D integration applications.

In the prior art, the concept and the device of a programmable via structure and fabricating the same using 3D integration are proposed. Although such proposals have been made, prior art programmable via structures are designed for three-terminal applications and such structures are not good practical use when one intends to switch and control the signal from a separate current source.

In view of the above, there is a continued need for providing new and improved programmable via structures that can be used in applications in which one needs to switch and control the signal from a separate current source. That is, there is a need for a semiconductor structure that includes programmable vias that provide a fast and reliable logic switching medium.

SUMMARY OF THE INVENTION

The present invention provides a semiconductor structure that includes two programmable vias (i.e., a switch unit device) each of which contains a phase change material that are integrated with a heating material. In particular, the present invention provides a structure in which two programmable vias, each containing a phase change material, are located on opposing surfaces of a heating material. Each end portion of an upper surface of the heating material is connected to a metal terminal. These metal terminals, which are in contact with the end portions of the upper surface of the heating material, can be each connected to an outside component that controls and switches the resistance states of the two programmable vias. The two programmable vias of the inventive structure are each connected to another metal terminal. These metal terminals that are associated with the programmable vias can be also connected to a circuit block that may be present in the structure.

The inventive structure thus provides a four-terminal semiconductor structure, two terminals that are connect to end portions of an upper surface of a heating material and two terminals that are connected to the two programmable vias. The four-terminal structure uses two of the terminals that are connected to the programmable vias for connecting to regular circuits, while the other two terminals that are connected to the heating material are used for contacting to an outside circuit. As such, when the resistance state of the programmable vias changes, it switches and controls the ON/OFF of the block programmable vias connected to them.

In general terms, the present invention provides a programmable via-containing structure that includes:

a semiconductor substrate;

a first dielectric layer located on a surface of said semiconductor substrate, said first dielectric layer having a conductive material embedded therein;

a second dielectric layer located atop the first dielectric layer and said conductive material, said second dielectric layer including at least one first via filled with a first phase change material, said first phase change material having a surface directly contacting an upper surface of the conductive material;

a patterned heating material located on an upper surface of the second dielectric layer and directly atop the at least one first via;

a third dielectric layer having at least one second via filled with a second phase change material located on said patterned heating material and exposed surfaces of said second dielectric layer, said at least one second via is substantially aligned to said at least one first via; and a patterned diffusion barrier located on an exposed surface of said at least one second via.

In the inventive structure, the phase change materials of the programmable vias can be switched between a resistive state and a conductive state by the buried heating material that is located atop and beneath the vias including the phase change material during a programmed heating cycle. A typical programmed heating cycle includes: 1. heating the PCM in the vias above its melting temperature, which is usually higher than about 600° C. by applying a rapid high current (voltage) pulse in the heating material, for example, a few nano seconds, to the high resistance state. 2. heating the PCM in the vias below its melting temperature, which is usually from about 100° to about 600° C. by applying a wide low current (voltage) pulse in the heating material, for example, a few micron seconds, to the low resistance state.

The inventive structure also includes first and second conductively filled contact vias, each of which extends through the third dielectric layer to an upper surface of the patterned heating material. The first and second conductively filled contact vias are located at end portions of the patterned heating material. A third conductively filled contact via extends through the third dielectric layer and the second dielectric layer to an upper surface of the conductive material that is embedded within the first dielectric layer. A patterned conductive material is located atop each of the conductively filled vias as well as atop the diffusion barrier material that is present on the second via.

The present invention also provides a method of fabricating such a semiconductor structure. The inventive method includes:

providing a first dielectric layer located on a surface of said semiconductor substrate, said first dielectric layer having a conductive material embedded therein;

providing a second dielectric layer located atop the first dielectric layer and said conductive material, said second dielectric layer including at least one first via filled with a first phase change material, said first phase change material having a surface directly contacting an upper surface of the conductive material;

providing a patterned heating material located on an upper surface of the second dielectric layer and directly atop the at least one first via;

providing a third dielectric layer having at least one second via filled with a second phase change material located on said patterned heating material and exposed surfaces of said second dielectric layer, said at least one second via is substantially aligned to said at least one first via; and providing a patterned diffusion barrier located on an exposed surface of said at least one second via.

The inventive method also includes providing first and second conductively filled contact vias, each of which extends through the third dielectric layer to an upper surface of the heating material. The first and second conductively filled contact vias are located at end portions of the patterned heating material. A third conductively filled contact via is also formed that extends through the third dielectric layer and the second dielectric layer to an upper surface of the conductive material that is embedded within the first dielectric layer. A patterned conductive material is provided atop each of the conductively filled vias as well as atop the diffusion barrier material that is present on the second via.

BRIEF DESCRIPTION OF THE DRAWINGS

FIGS. 2A-2M are pictorial representations (through cross sectional views) depicting the basic processing steps that are employed in the present invention for fabricating the semiconductor structure shown in FIG. 1.

DETAILED DESCRIPTION OF THE INVENTION

The present invention, which provides a semiconductor structure including at least two vertically oriented programmable vias (i.e., a switch unit device) which are both integrated with a heating element as well as a method of fabricating the same, will now be described in greater detail by referring to the following description and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a semiconductor structure including at least two programmable vias that are filled with phase changes materials that are integrated with a heating material. In particular, one of the programmable vias is located beneath the heating material, while the other programmable via is located above the heating material. That is, each of the programmable vias is in contact with opposing surfaces of a heating material. The at least two programmable vias are substantially aligned to each other. The two programmable vias can be contacted to two different terminals, while end portions of the upper surface of the heating material can be connected to two different terminals. Thus, the inventive structure is a four-terminal device which can control and switch signals from an outside power source.

Figure 1:
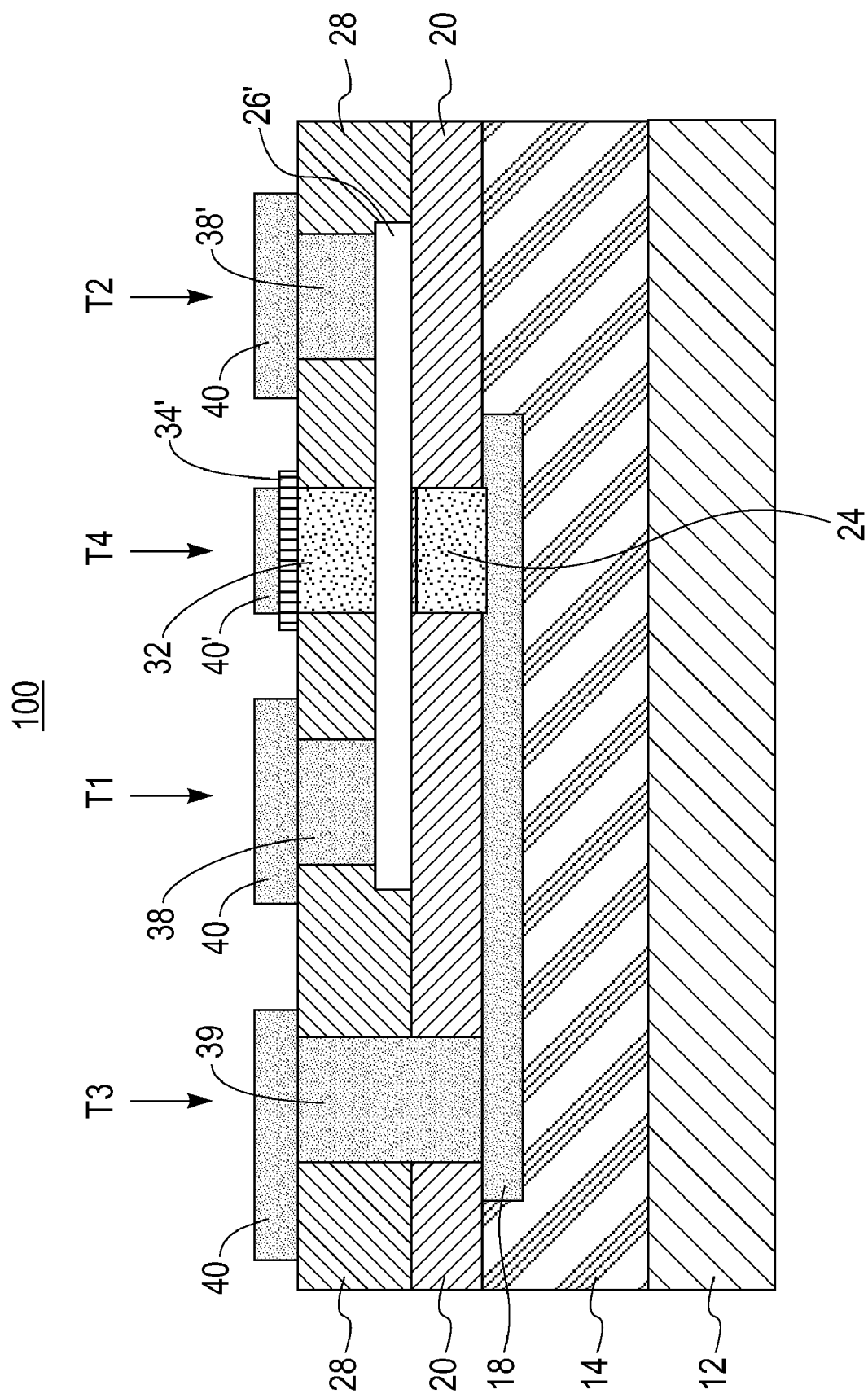
FIG. 1 is a pictorial representation (through a cross sectional view) illustrating the inventive semiconductor structure.

Reference is first made to FIG. 1 which provides a pictorial illustration (through a cross sectional view) of the inventive structure. As shown, the inventive structure 100 includes a semiconductor substrate 12 such as, for example, a Si-containing semiconductor substrate. A first dielectric layer 14 such as, for example, a thermal oxide, is located atop the semiconductor substrate 12. The first dielectric layer 14 includes a conductive material 18 that is embedded within the first dielectric layer 14. A second dielectric layer 20 is located atop the first dielectric layer 14 as well as exposed surfaces of the conductive material 18.

Within the second dielectric layer 20 there is present at least one first via that is filled with a first phase change material 24 (hereinafter also referred to a first programmable via 24). As illustrated in FIG. 1, the first phase change material 24 has a surface that directly contacts an upper surface of the conductive material 18.

A patterned heating material 26', such as, for example, TaSiN, is located atop the second dielectric layer 20 as well as exposed surfaces of the first programmable via 24. A third dielectric layer 28 which includes at least one second via that is filled with a second phase change material 32 (hereinafter also referred to a second programmable via 32) is located atop the second dielectric layer 20 as well as the patterned heating material 26'.

As is illustrated, the second programmable via 32 contacts an upper surface of the patterned heating material 26'. As such, the inventive structure includes at least a first programmable via 24 and a second programmable 32 that are located on opposing surfaces of the patterned heating material 26'.

A patterned diffusion barrier 34' is located on an exposed surface of the second programmable via 32.

The inventive structure also includes first and second conductively filled contact vias 38 and 38' respectively, extending through the third dielectric layer 28 and in contact with an upper surface of the patterned heating material 26'. Note that the first and second conductively filled contact vias are located at end portions of the patterned heating material 26'. A third conductively filled contact via 39 extends through the third dielectric layer 28 and the second dielectric layer 20 to an upper surface of the conductive material 18 which is embedded within the first dielectric layer 14.

As is also shown in FIG. 1, each of the conductively filled vias (38, 38' and 39) is capped with a conductive material 40. It is emphasized that the conductive material 40 is also present within the conductively filled vias 38, 38' and 39. A conductive material 40' (which is the same material as that of conductive material 40) is also located atop the patterned diffusion barrier 34' that is present on the second programmable via 32. In FIG. 1, T1 stands for a first terminal, T2 stands for a second terminal, T3 stands for a third terminal and T4 stands for a fourth terminal. T3 and T4 are in contact with the two programmable vias 24 and 32, respectively, T1 and T2 are connected to end portions of the patterned heating material 26'.

Figure 2A:
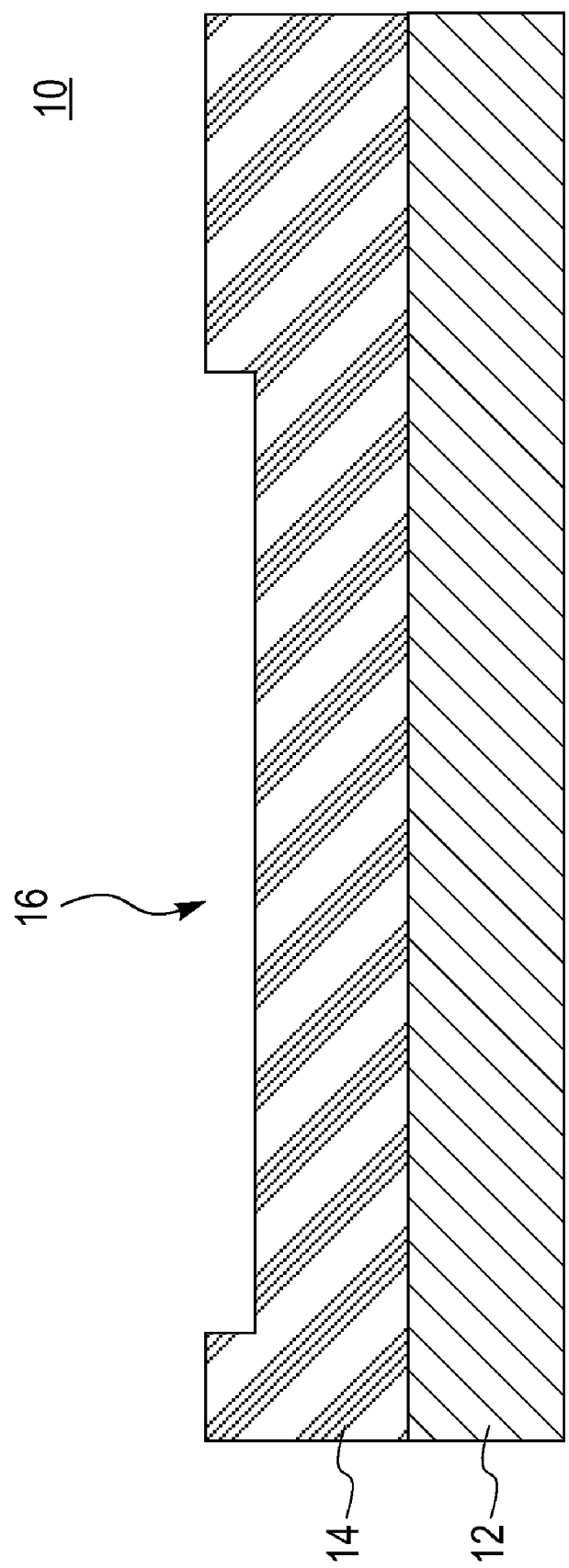

Reference is now made to FIGS. 2A-2M which illustrate the basic processing steps that are used in subsequently forming the inventive structure shown in FIG. 1. Specifically, FIG. 2A illustrates an initial structure 10 that is employed in the present invention. As shown, the initial structure 10 includes a semiconductor substrate 12 and a first dielectric layer 14 having at least one opening 16 located therein. The at least one opening 16 forms the area in which a conductive material 18 will be subsequently formed.

The initial structure 10 shown in FIG. 2A is made by first providing the semiconductor substrate 12. The term "semiconductor substrate" as used herein refers to any material having semiconductor properties. Illustratively, the semiconductor substrate 12 comprises Si, SiGe, SiGeC, SiC, Ge alloys, GaAs, InAs, InP as well other III-V or II-VI compound semiconductors. The semiconductor substrate 12 may also comprise a layered semiconductor such as, for example, Si/SiGe, a silicon-on-insulator (SOI) or a SiGe-on-insulator (SGOI). Preferably, the semiconductor substrate 12 is composed of a Si-containing semiconductor material, i.e., a semiconductor material that includes silicon.

The semiconductor substrate 12 may comprise a single crystal orientation or it may be a hybrid semiconductor substrate having surface regions of different crystal orientation. The semiconductor substrate 12 may include a strained semiconductor material, an unstrained semiconductor or a combination of strained and unstrained semiconductor materials are also within the scope of the instant invention. The semiconductor substrate 12 may be doped, undoped or contain doped and undoped regions (not specifically shown) therein.

If other devices are present, such as field effect transistors and/or bipolar transistors, one or more isolation regions such as trench isolation regions and/or field oxide isolation regions may be present. When such isolation regions are present, conventional techniques well known to those skilled in the art can be used in forming the same. In the drawings that accompany the present application, no other types of devices are shown.

The first dielectric layer 14 having the at least one opening 16 is then formed on an upper surface of the semiconductor substrate 12. The first dielectric layer 14 comprises any material having insulating properties including, for example, an oxide, a nitride, an oxynitride, a spun-on glass or multilayers thereof. Preferably, the first dielectric layer 14 is an oxide such as, for example, an oxide of silicon. The thickness of the first dielectric layer 14 may vary depending on the type of insulating material employed as well as the technique that is used in forming the same. Typically, and by way of illustration, the thickness of the first dielectric layer 14 is from about 5 to about 2000 nm.

The first dielectric layer 14 is formed atop the surface of the semiconductor substrate 12 utilizing a conventional deposition process such as, for example, chemical vapor deposition (CVD), plasma enhanced chemical vapor deposition (PECVD), atomic layer deposition (ALD), chemical solution deposition, physical vapor deposition (PVD) or spin-on coating. Alternatively, the first dielectric layer 14 can be formed utilizing a thermal process such as, for example, oxidation, nitridation or oxynitridation. In a preferred embodiment, the first dielectric layer 14 is a thermal oxide.

After forming the first dielectric layer 14 on a surface of the semiconductor substrate 12, the at least one opening (via, line or combined via and line) 16 is formed into the first dielectric layer 14 utilizing lithography and etching. The lithographic step includes applying a conventional photoresist material (not shown) to an upper surface of the first dielectric layer 14, exposing the photoresist material to a desired pattern of radiation and developing the exposed resist. After the development step, an etching process including, for example, reactive ion etching (RIE), ion beam etching, plasma etching or laser ablation is used to transfer the pattern from the exposed and developed photoresist to the underlying first dielectric layer 14. The resist is removed after the etching process utilizing a conventional resist stripping process well known to those skilled in the art.

Figure 2B:
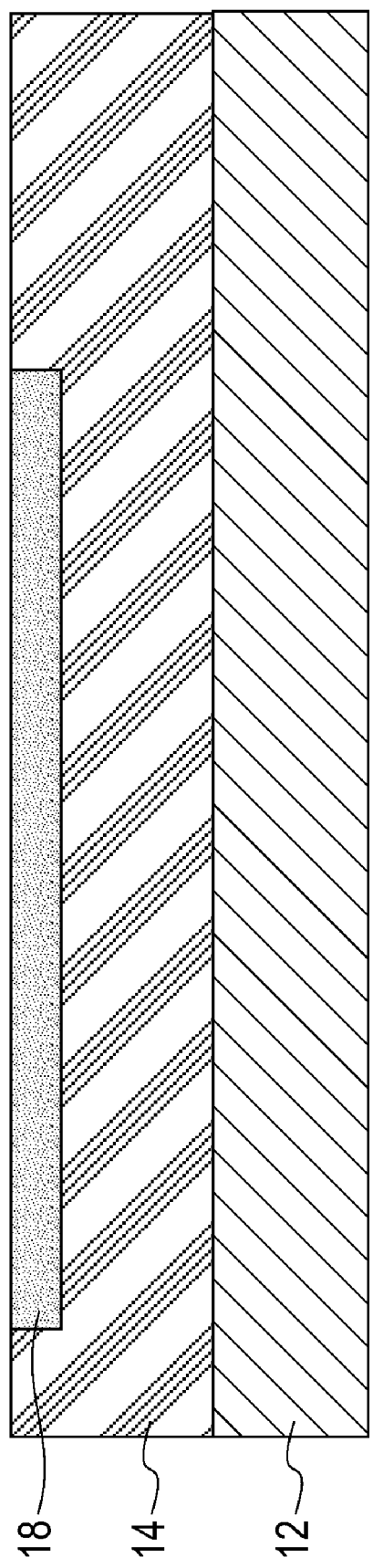

Next, and a shown in FIG. 2B, a conductive material 18 is formed into the at least one opening 16 that is located within the first dielectric layer 14. The conductive material 18 comprises any conductive material including, for example, a metal, a metal alloy, a metal silicide and multilayers thereof. Preferably, the conductive material 18 is a conductive metal including one of Al, W and Cu. In one embodiment, W is employed as the conductive material 18. It is noted that the conductive material 18 forms a wiring region within the inventive structure for contacting the first (i.e., lower) programmable via to an outside connection.

The conductive material 18 is formed within the at least one opening 16 utilizing a conventional deposition process, followed by planarization. The conventional deposition process used in forming the conductive material 18 includes, for example, CVD, PECVD, ALD, sputtering, plating, chemical solution deposition and PVD. The planarization process, which provides a structure in which the upper surface of the conductive material 18 is coplanar with an upper surface of the first dielectric layer 14, includes chemical mechanical polishing (CMP), grinding or a combination thereof. Typically, CMP is employed.

Figure 2C:
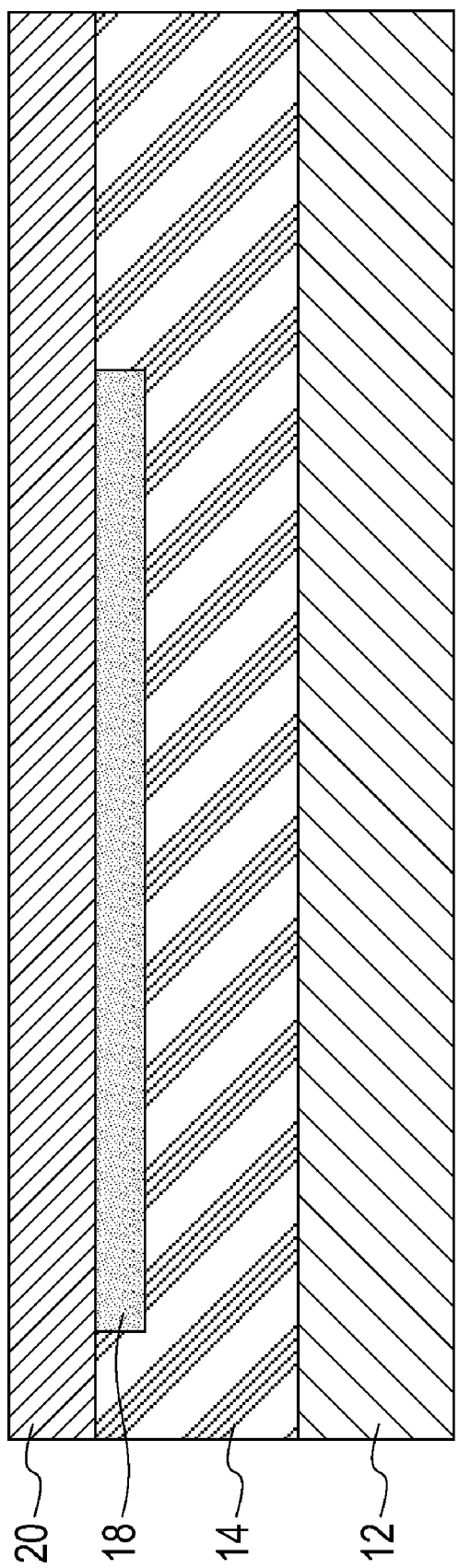
Figure 2D:
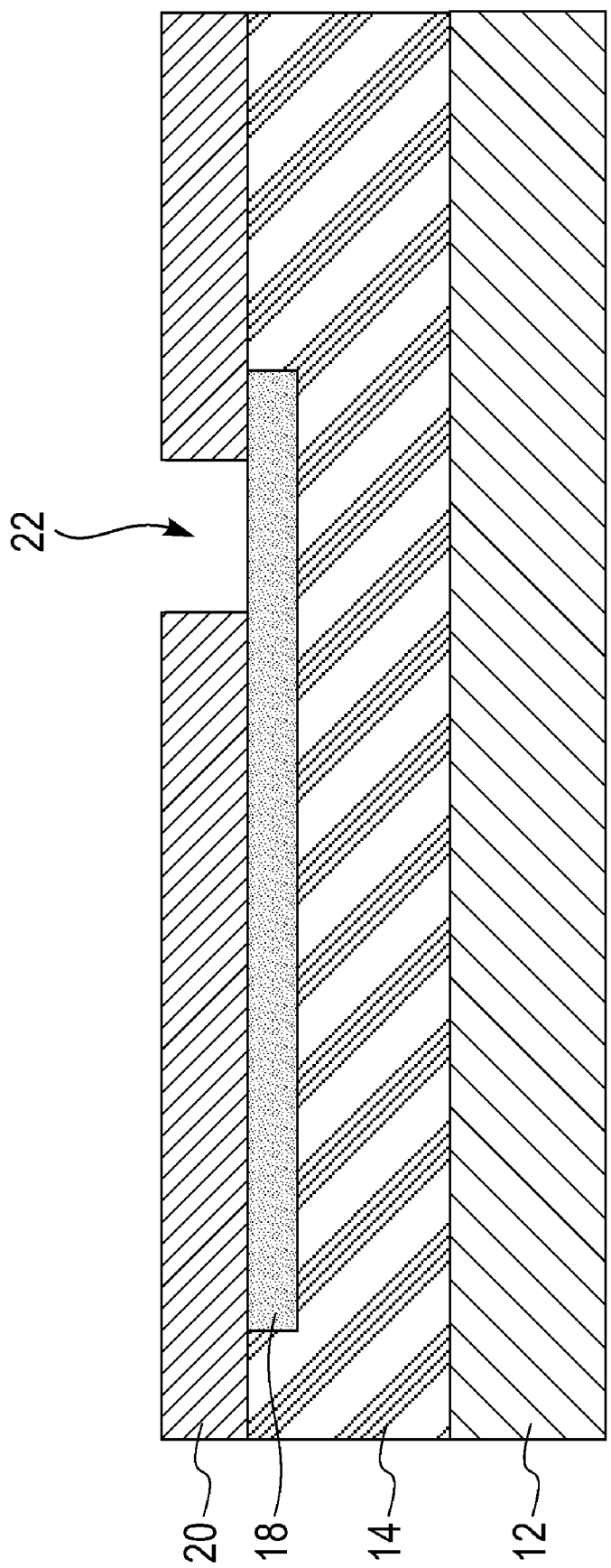

After providing the conductive material 18 to the at least one opening 16 in the first dielectric layer 14, a second dielectric layer 20 is applied to the structure shown in FIG. 2B providing the structure shown, for example, in FIG. 2C. The second dielectric layer 20 may comprise the same or different material as the first dielectric layer 14. Typically, the second dielectric layer 20 is an oxide such as, for example, an oxide of silicon. The second dielectric layer 20 is formed utilizing one of the above-mentioned techniques as used in forming the first dielectric layer 14. Typically, a deposition process is used in forming the second dielectric layer 20. The thickness of the second dielectric layer 20 is within the range mentioned above for the first dielectric layer 14.

At least one first via opening 22 is then formed into the second dielectric layer 20 utilizing lithography and etching, both of which have been described above in connection with forming the at least one opening 16 into the first dielectric layer 14. It is noted that the width of the at least one first via opening 22 is generally smaller than the width of the at least one opening 16 formed into the first dielectric layer 14. A typically width of the at least one first via opening 22 is from about 5 to about 1000 nm. The resultant structure including the at least one first via opening 22 formed into the second dielectric layer 20 is shown, for example, in FIG. 2D.

Figure 2E:
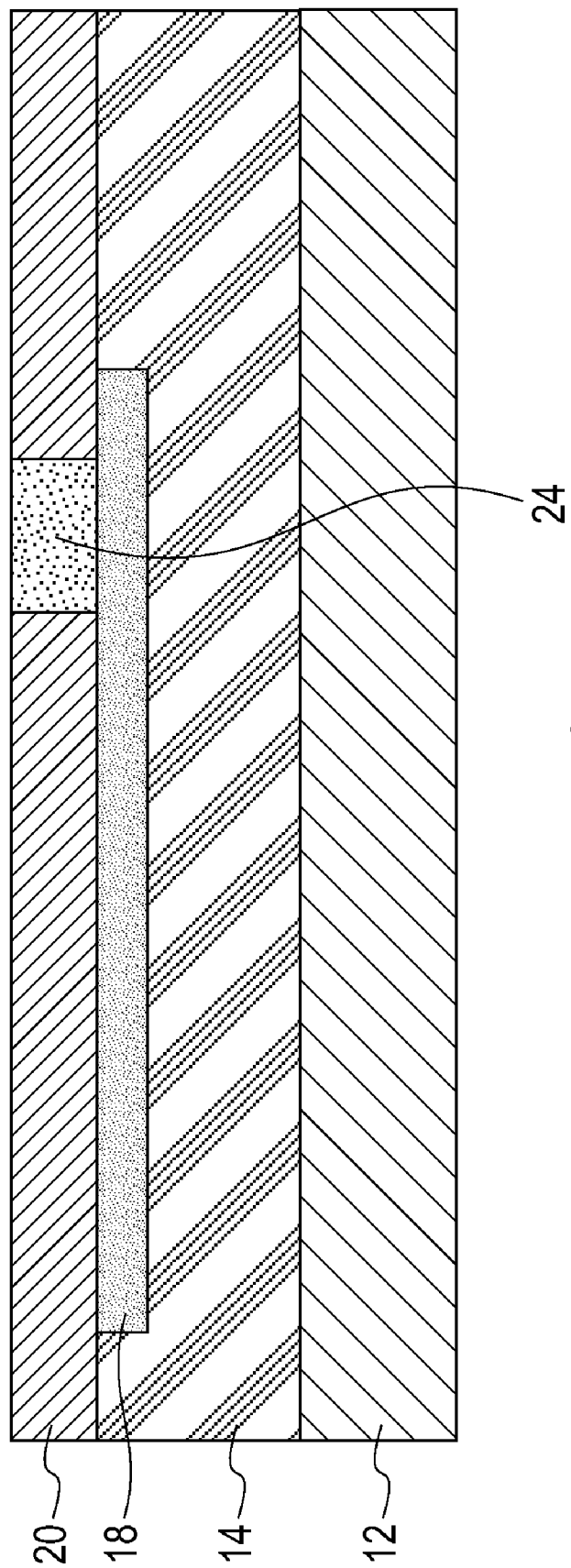

FIG. 2E shows the structure after the at least one first via opening 22 is provided with a first phase change material 24. The first phase change material (PCM) 24 is formed over all exposed surfaces of the structure shown in FIG. 2D including within the at least one first via opening 22 as well as on the exposed surfaces of the second dielectric layer 20. Within the at least one first via opening 22 itself, the first PCM 24 is in direct contact with an underlying portion of the conductive material 18.

The first PCM 24 is a material having electrical properties (e.g., resistance, capacitance, etc.) that may be changed through the application of energy such as, for example, heat, light, voltage potential, or electrical current. Examples of a PCM include a chalcogenide material or a chalcogenide alloy. A chalcogenide material is a material that includes at least one element from Group VIB (IUPAC nomenclature) of the Periodic Table of Elements, i.e., any of the elements of tellurium, sulfur, or selenium. The chalcogenide may be a pure material or it can be doped with N and/or Si. In a preferred embodiment of the present invention, the first PCM 24 is comprised of $Ge_2Sb_2Te_5$ or GeSb.

The first PCM 24 is formed utilizing a deposition process including, for example, CVD, PECVD, chemical solution deposition, sputtering, and evaporation. The thickness of the as deposited first PCM 24 may vary. Typically, the as deposited thickness of the first PCM 24 is from about 5 to about 1000 nm, with a thickness from about 10 to about 500 nm being even more typical.

After deposition of the first PCM 24 atop all exposed surfaces, a planarization process is performed to remove the first PCM material 24 that is located outside the at least one first via opening 22 providing the structure shown, for example, in FIG. 2E. As is shown, the first PCM 24 (i.e., first programmable via) remaining after planarization has an upper surface that is substantially coplanar to the upper surface of the second dielectric layer 20. Any conventional planarization process including chemical mechanical planarization (CMP) and/or grinding may be employed.

Figure 2F:
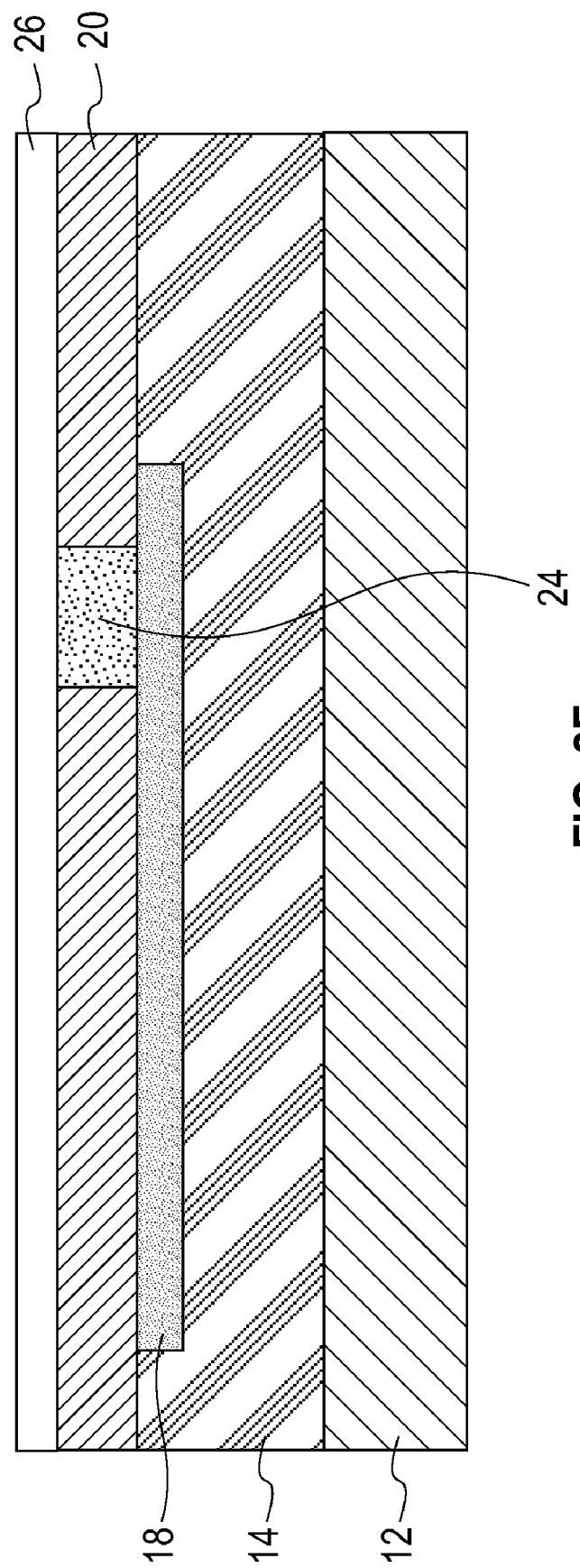

A heating material 26 is then formed on the upper surface of the second dielectric layer 20 as well as atop the first PCM 24 that remains in the at least one first via opening 22 providing the structure shown, for example, in FIG. 2F. The term "heating material" is used throughout the present application to denote any material (typically an oxide and/or nitride) whose resistivity is higher than the resistivity of the metal wiring to be subsequently formed. Typically, the heating material 26 employed in the present invention has a resistivity from about 100 to about 10000 ohm cm with a resistivity from about 500 to about 3000 ohm cm being even more typical. In one preferred embodiment of the present invention, the heating material 26 is a silicided nitride such as, for example, TaSiN, having a resistivity of about 2000 ohm cm. In another embodiment, the heating material 26 is an oxide such as, for example, $CrO_2$ or $RuO_2$. In a highly preferred embodiment of the present invention, $Ta_xSi_yN_z$ (where x, y and z are from 0 to approximately 1) is used as the heating material 26.

The heating material 26 is formed utilizing techniques well known to those skilled in the art. For example, the heating material 26 can be formed utilizing a sputtering technique including, for instance, physical vapor deposition (PVD). The heating material 26 employed in the present invention has a thickness from about 5 to about 100 nm, with a thickness from about 10 to about 50 nm being more preferred.

After providing the structure shown in FIG. 2F, the heating material 26 is patterned to provide a patterned heating material 26' located on a surface of the second dielectric layer 20 as well as atop the surface of the remaining first PCM 24. The resultant structure including the patterned heating material 26' is shown, for example, in FIG. 2G. The patterning of the heating material 26 is achieved by first applying a conventional photoresist (not shown) to the heating material 26 shown in FIG. 2F. After application of the photoresist to the heating material 26, the photoresist is subjected to a lithographic step that includes pattern wise exposure of the photoresist to a desired pattern of radiation and development of the exposed photoresist utilizing a conventional resist developer. The patterned photoresist protects a portion of the heating material 26, while leaving at least one other portion unprotected. The unprotected portions of the heating material 26 not including the patterned resist, are then removed by etching. Any etching process that removes the unprotected portions of the heating material 26 selective to the patterned resist can be used. Typically, a reactive ion etching (RIE) process or another like dry etching process is used. As shown, the etching process stops atop the upper surface of the second dielectric layer 20. The photoresist used in forming the patterned heating material 26' is typically stripped after the etching process.

Figure 2G:
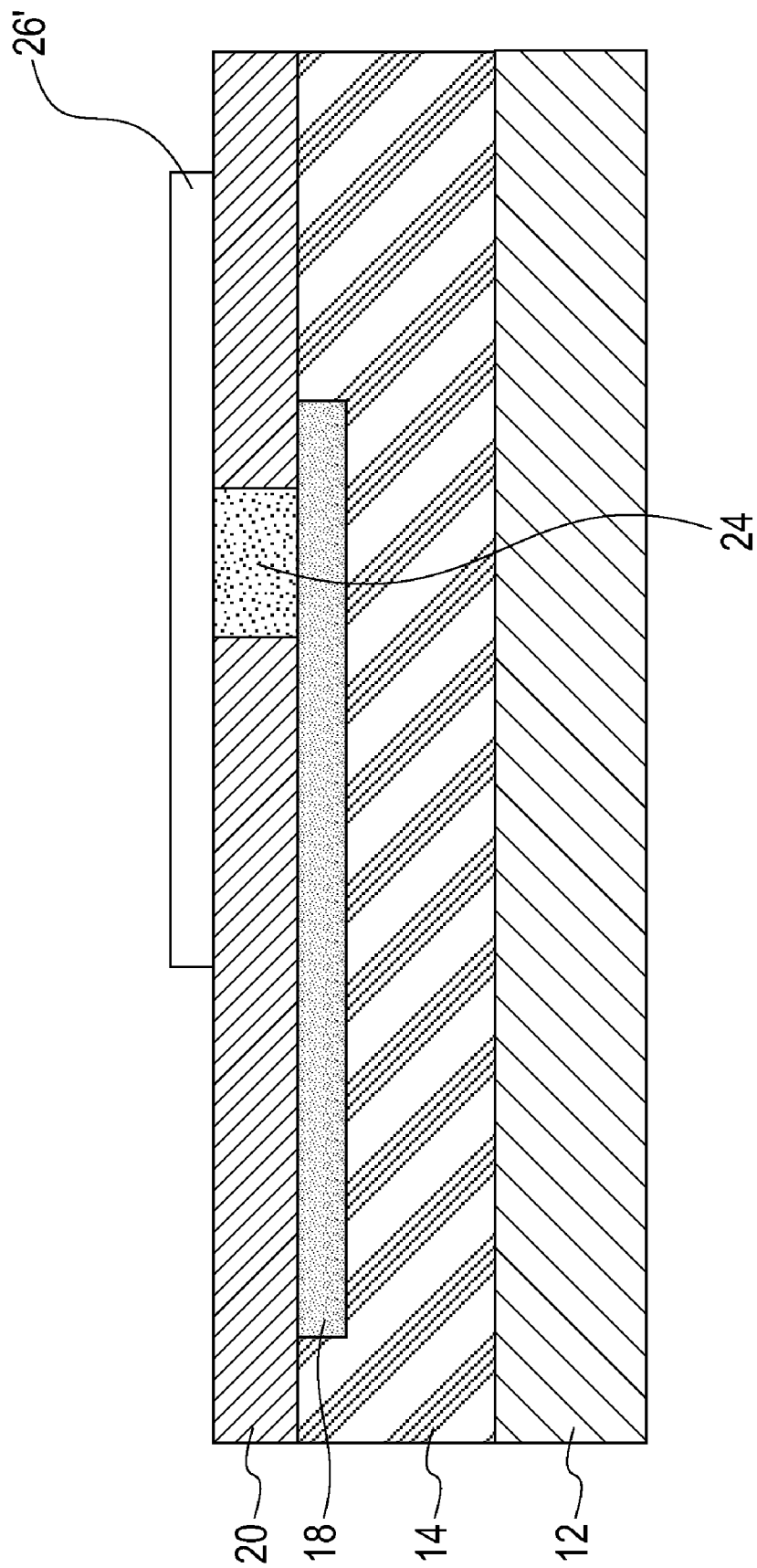
Figure 2H:
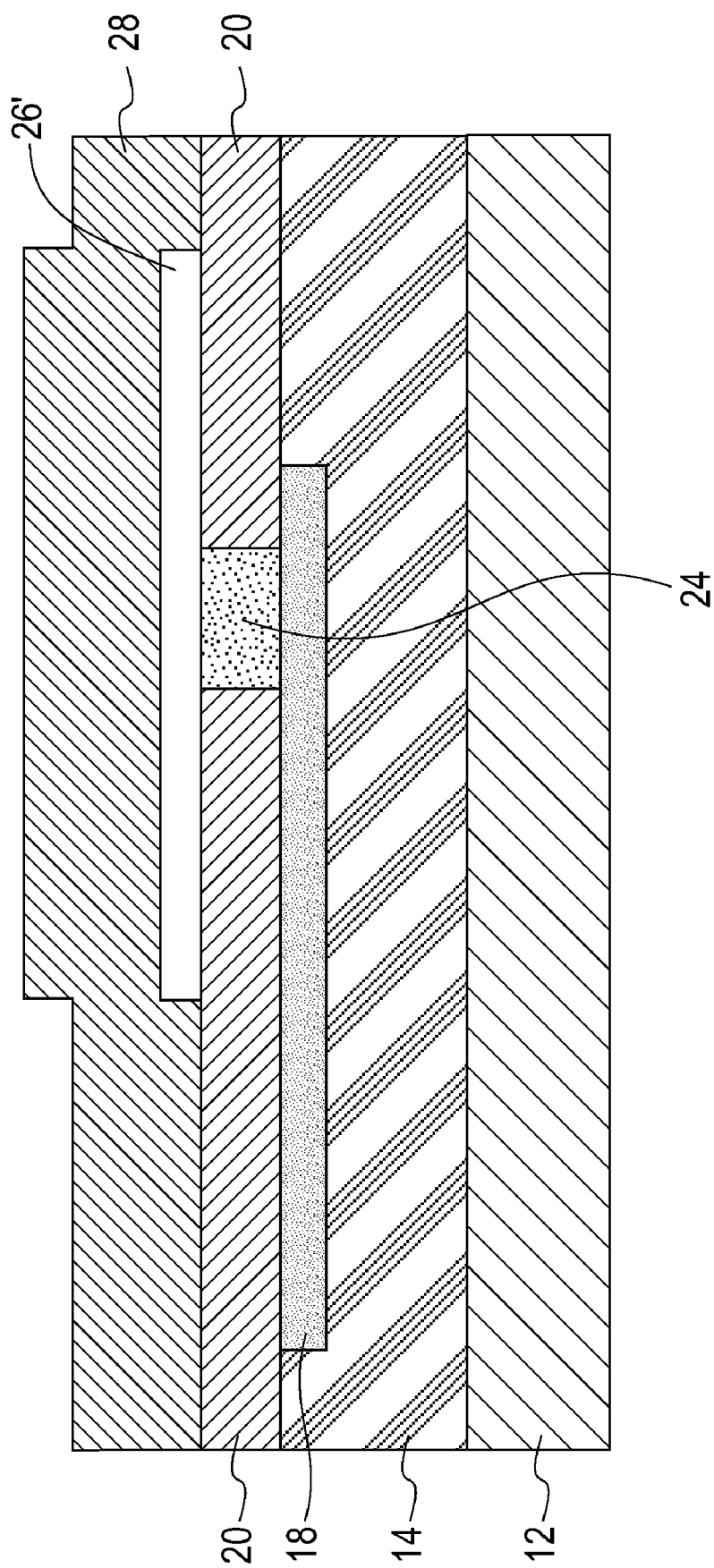
Figure 2I:
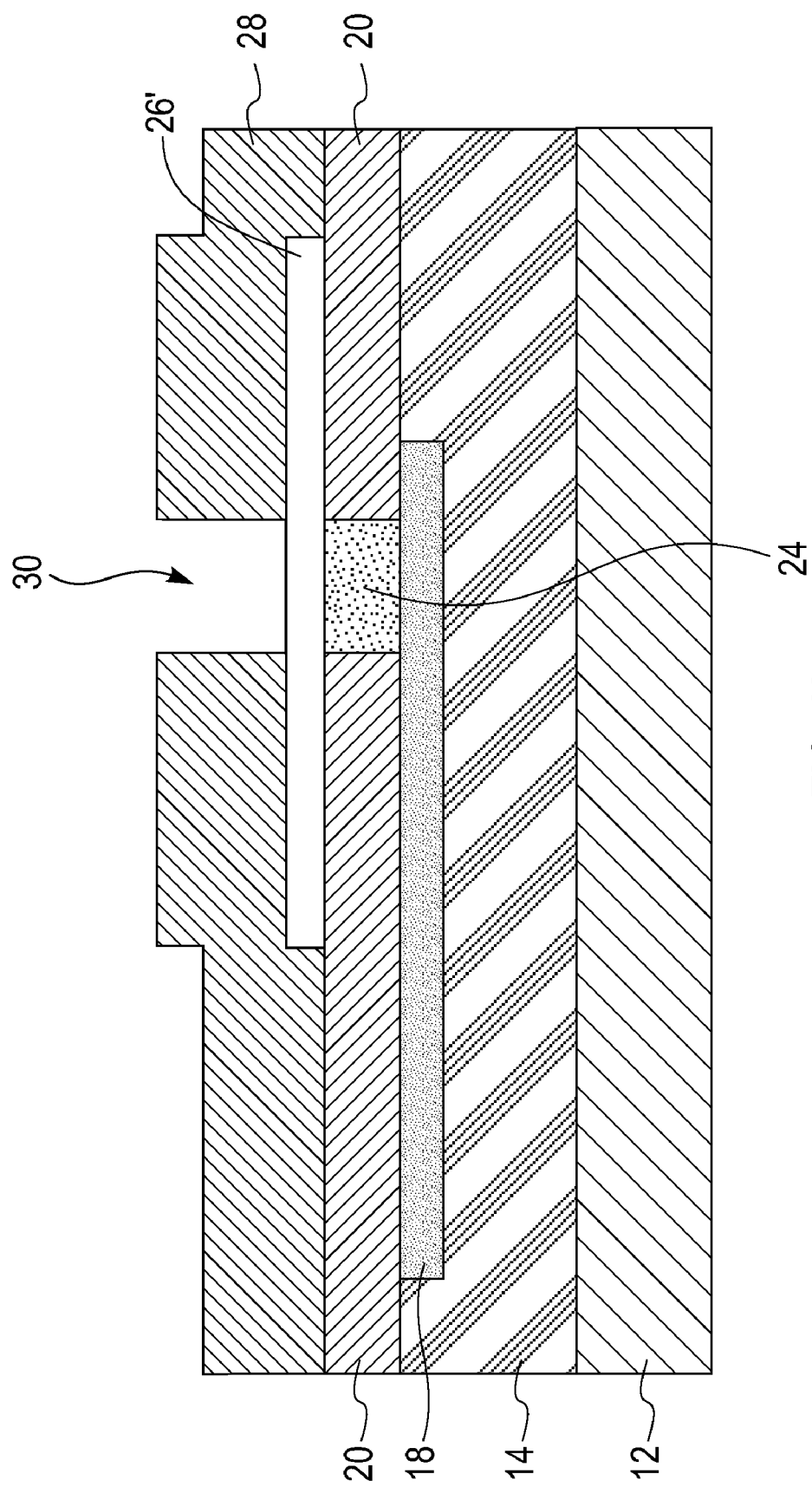

After patterning the heating material 26 into patterned heating material 26', a third dielectric layer 28 is formed atop the structure shown in FIG. 2G providing the structure shown, for example, in FIG. 2H. As shown, the third dielectric layer 28 is formed atop exposed surfaces of the second dielectric layer 20 as well as atop the patterned heating material 26'. The third dielectric layer 28 may comprise the same or different dielectric material as the second dielectric layer 20. Typically, the second and third dielectric layers (20 and 28, respectively) are comprised of an oxide of silicon. The third dielectric layer 28 is typically formed utilizing a conventional deposition process. In some embodiments, the third dielectric layer 28 may be thermally grown. The thickness of the third dielectric layer 28 is typically within the range mentioned above for the first dielectric layer 14.

At least one second via opening 30 which is substantially aligned to the at least one first via opening 22 is formed into the third dielectric layer 28 utilizing the technique mentioned above for forming the at least one first via opening 22. The resultant structure including the at least one second via opening 30 is shown, for example, in FIG. 2I.

A second phase change material (PCM) 32 is the formed within the at least one second via opening 30 utilizing the same technique as described above in forming the first PCM 24 within the at least one first via opening 22. That is, the second PCM 32 is formed by deposition and thereafter a planarization process is employed to provide the planar structure shown in FIG. 2J. The second PCM 32 may comprise the same or different, preferably, the same, material as that of the first PCM 24. In a preferred embodiment of the present invention, the second PCM 32 is comprised of $Ge_2Sb_2Te_5$ or GeSb. Note that the remaining second PCM 32 within the at least one second via opening 30 forms the second programmable via of the inventive structure. It is noted that the second PCM 32 has the same thickness as recited above for the first PCM 22.

Figure 2K:
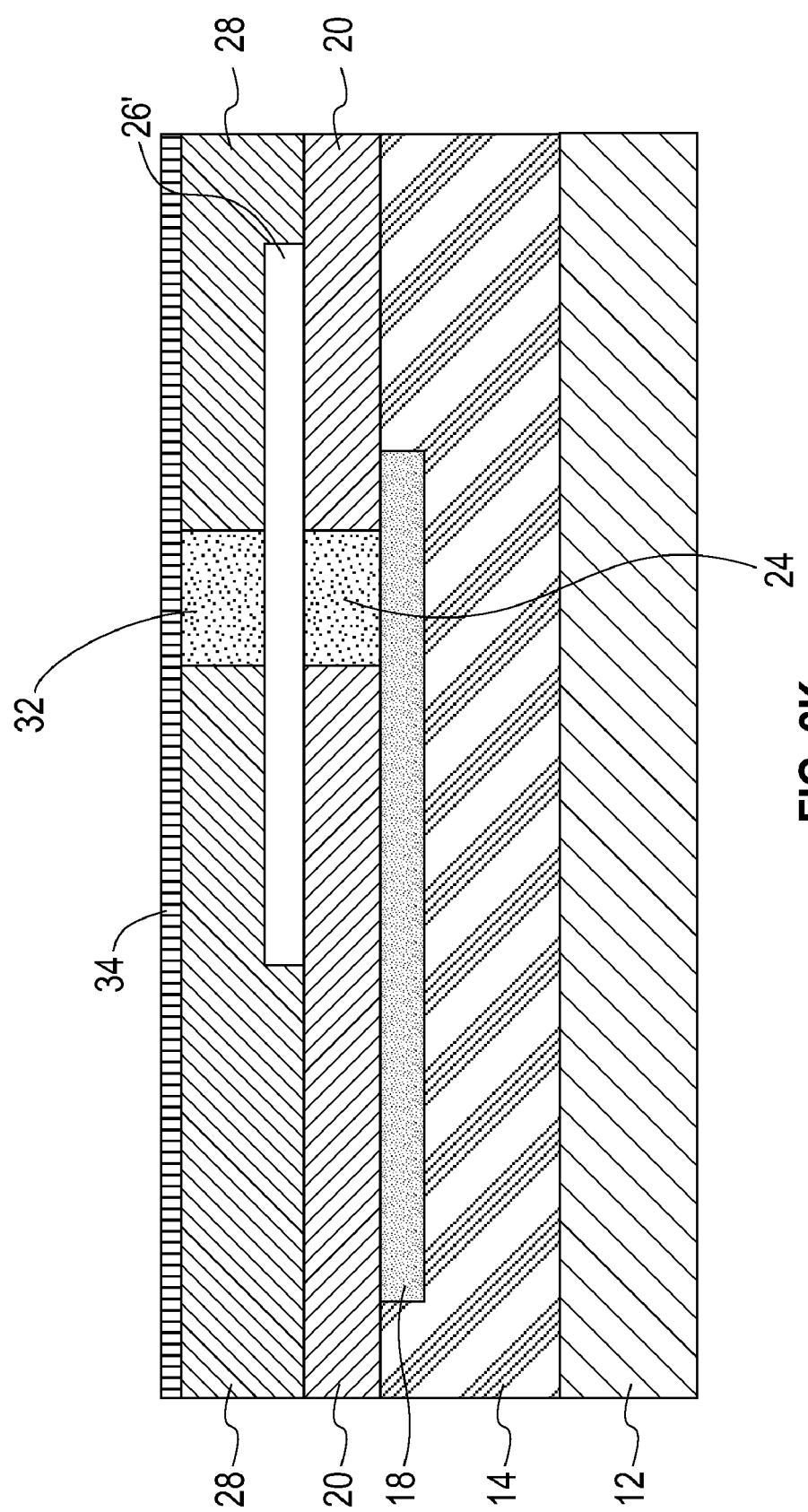

Next, and as illustrated in FIG. 2K, a diffusion barrier layer 34 is formed atop the upper surfaces of the third dielectric layer 28 as well as the second PCM 32 that remains in the at least one second via opening 30. The diffusion barrier layer 34 comprises any material which prevents diffusion of contaminates into the PCM filled via. The diffusion barrier layer 34 comprises at least one of Ta, TaN, Ti, TiN, Ru, ZrN and RuN. Typically, a stack of TiN/Ti or TaN/Ta is employed as the diffusion barrier layer 34.

The diffusion barrier layer 34 is formed utilizing a conventional deposition process including, for example, CVD, PECVD, sputtering, evaporation, chemical solution deposition and plating. The thickness of the diffusion barrier layer 34 may vary depending on the material of the layer as well as the technique used in forming the same. Typically, the diffusion barrier layer 34 has a thickness from about 1 to about 100 nm, with a thickness from about 10 to about 50 nm being even more typical.

Figure 2L:
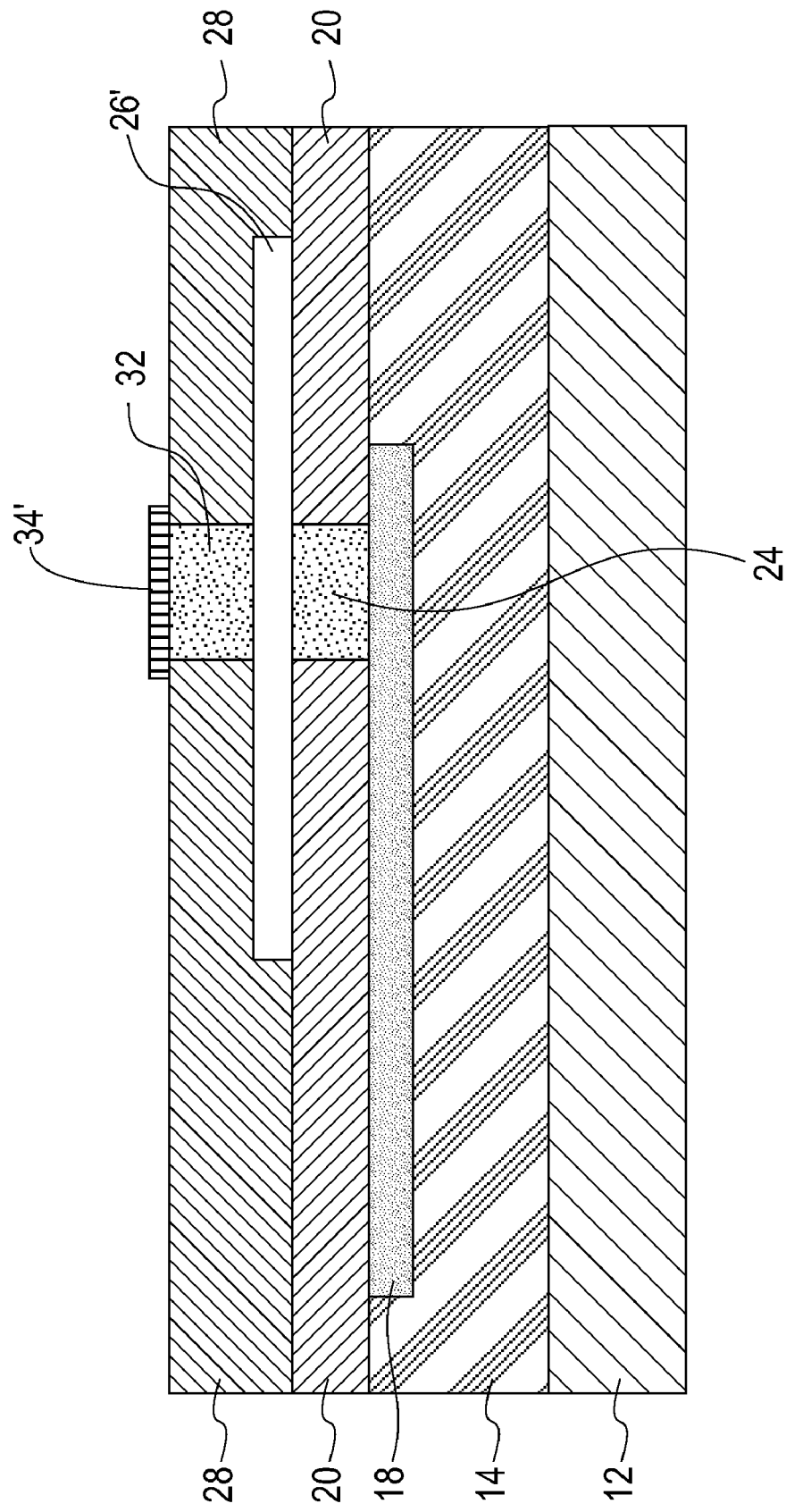

FIG. 2L illustrates the structure after the diffusion barrier layer 34 has been patterned by lithography and etching forming patterned diffusion barrier layer 34' located atop the second PCM 32 filled via. In some embodiments, the patterned diffusion barrier layer 34' may extend onto a surface of the third dielectric layer 28 that lies adjacent to the second PCM 32 filled via. The lithographic step is the same as described above. The etching process used at this point of the invention removes the exposed barrier layer 34 selective to the patterned photoresist. RIE or another like dry etching process can be employed to etch and subsequently pattern the diffusion barrier layer 34.

Figure 2M:
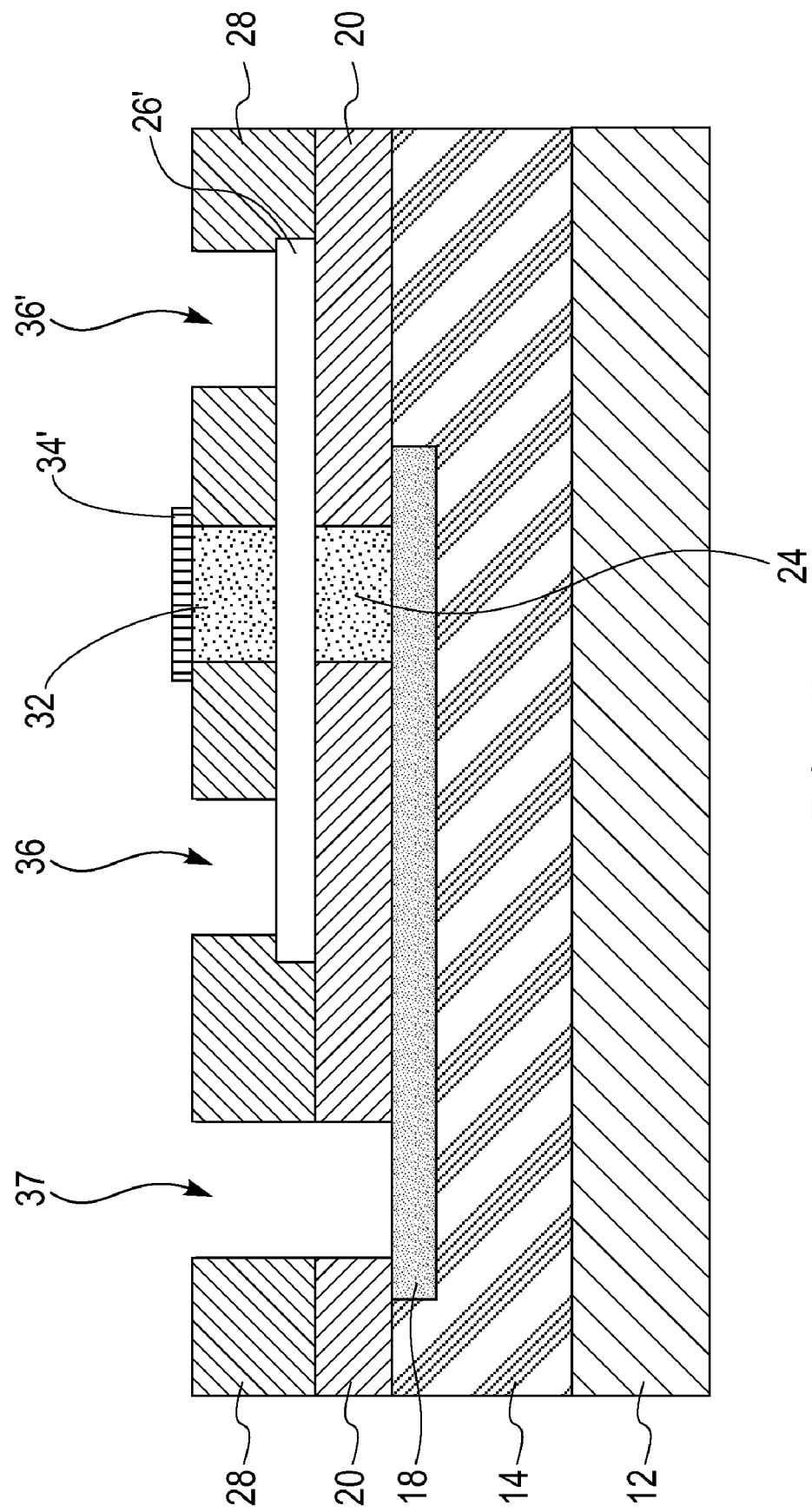

After forming the patterned diffusion barrier layer 34', contact via openings 36, 36' and 37 are formed as is illustrated in FIG. 2M. The contacts via openings are formed utilizing the same processing technique used in forming first and second via openings including the PCM. As is shown, the etching of the contact via openings 36 and 36' stops on an exposed upper surface of the patterned heating material 26', while the etching of contact via opening 37 stops atop the conductive material 18 that is present in the first dielectric layer 14.

Next, patterned photoresist pads (not shown) are formed on the exposed upper surface of the third dielectric layer 28. The patterned photoresist pads are formed by application of a blanket layer of photoresist material to the structure shown in FIG. 2M, exposing the blanket layer of photoresist material to radiation and developing the exposed resist utilizing a conventional resist developer.

A conductive material, typically a conductive metal or metal alloy, is then deposited filling the contact via opening 36, 36' and 37 and covering the exposed surfaces of the third dielectric layer 28 not protected by the patterned photoresist pads. The conductive material which forms the conductive wiring of the inventive structure comprises an elemental metal such as for example, W, Cu, Al or alloys thereof such AlCu. Preferably, W is used as the conductive material. The conductive material is formed utilizing any conventional deposition process including, for example, CVD, PECVD, chemical solution deposition, plating, sputtering and evaporation.

The above steps provide the conductively filled vias (38, 38' and 39) to the structure (See, FIG. 1). Each of the conductively filled vias is capped with a conductive material 40 (See FIG. 1 as well). It is emphasized that the conductive material 40 is also present within the conductively filled vias 38, 38' and 39. A conductive material 40, (which is the same material as that of conductive material 40) is also located atop the patterned diffusion barrier 34' that is present on the second programmable via 32 (See FIG. 1).

Next, a conventional lift off process is used to remove the patterned photoresist pads from the structure providing the inventive structure shown in FIG. 1.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor structure comprising:
a semiconductor substrate;
a first dielectric layer located on a surface of said semiconductor substrate, said first dielectric layer having a conductive material embedded therein;
a second dielectric layer located atop the first dielectric layer and said conductive material, said second dielectric layer including at least one first via filled with a first phase change material, said first phase change material having a surface directly contacting an upper surface of the conductive material;
a patterned heating material located on an upper surface of the second dielectric layer and directly atop the at least one first via, wherein a lower surface of the patterned heating material is in direct contact with an upper surface of the first phase change material;
a third dielectric layer having at least one second via filled with a second phase change material located on said patterned heating material and exposed surfaces of said second dielectric layer, said at least one second via is substantially aligned to said at least one first via; and
a patterned diffusion barrier located on an exposed upper surface of said at least one second via, wherein a lower surface of the second phase change material is in direct contact with an upper surface of the patterned heating material.

2. The semiconductor structure of claim 1 further comprising first and second conductively filled contact vias, each of which extends through the third dielectric layer to the upper surface of the patterned heating material and a third conductively filled contact via extending through the third dielectric layer and the second dielectric layer to an upper surface of the conductive material which is embedded within the first dielectric layer.

3. The semiconductor structure of claim 1 wherein said first and second phase change materials each comprise a chalcogenide material or a chalcogenide alloy.

4. The semiconductor structure of claim 1 wherein said first and second phase change materials each comprise $Ge_2Sb_2Te_5$ or GeSb.

5. The semiconductor structure of claim 1 wherein said patterned diffusion barrier is comprised of at least one of Ta, TaN, Ti, TiN, Ru, ZrN and RuN.

6. The semiconductor structure of claim 1 wherein said patterned heating material is a nitride or an oxide having a resistivity of about 100 ohm cm or greater.

7. The semiconductor structure of claim 6 wherein said patterned heating material is $Ta_xSi_yN_z$ where x, y and z are approximately from 0 to 1, $CrO_2$ or $RuO_2$.

8. A semiconductor structure comprising:
a semiconductor substrate;
a first dielectric layer located on a surface of said semiconductor substrate, said first dielectric layer having a conductive material embedded therein;
a second dielectric layer located atop the first dielectric layer and said conductive material, said second dielectric layer including at least one first via filled with a first phase change material, said first phase change material having a surface directly contacting an upper surface of the conductive material;
a patterned heating material located on an upper surface of the second dielectric layer and directly atop the at least one first via, wherein a lower surface of the patterned heating material is in direct contact with an upper surface of the first phase change material;

a third dielectric layer having at least one second via filled with a second phase change material located on said patterned heating material and exposed surfaces of said second dielectric layer, said at least one second via is substantially aligned to said at least one first via, wherein a lower surface of the second phase change material is in direct contact with an upper surface of the patterned heating material;

a patterned diffusion barrier located on an exposed surface of said at least one second via; first and second conductively filled contact vias extending through the third dielectric layer and in contact with the upper surface of the patterned heating material; and a third conductively filled contact via extending through the third dielectric layer and the second dielectric layer to an upper surface of the conductive material which is embedded within the first dielectric layer, each of said conductively filled vias is capped with a conductive material, said conductive material is also located atop the patterned diffusion barrier material that is present on the second via.

9. The semiconductor structure of claim 8 wherein said first and second phase change materials each comprise a chalcogenide material or a chalcogenide alloy.

10. The semiconductor structure of claim 8 wherein said first and second phase change materials each comprise $Ge_2Sb_2Te_5$ or GeSb.

11. The semiconductor structure of claim 8 wherein said patterned diffusion barrier is comprised of at least one of Ta, TaN, Ti, TiN, Ru, ZrN and RuN.

12. The semiconductor structure of claim 8 wherein said patterned heating material is a nitride or an oxide having a resistivity of about 100 ohm cm or greater.

13. The semiconductor structure of claim 12 wherein said patterned heating material is $Ta_xSi_yN_z$ where x, y and z are approximately from 0 to 1, $CrO_2$ or $RuO_2$.

14. A method of fabricating a semiconductor structure comprising:

providing a first dielectric layer located on a surface of a semiconductor substrate, said first dielectric layer having a conductive material embedded therein;

providing a second dielectric layer located atop the first dielectric layer and said conductive material, said second dielectric layer including at least one first via filled with a first phase change material, said first phase change material having a surface directly contacting an upper surface of the conductive material;

providing a patterned heating material located on an upper surface of the second dielectric layer and directly atop the at least one first via, wherein a lower surface of the patterned heating material is in direct contact with an upper surface of the first phase change material;

providing a third dielectric layer having at least one second via filled with a second phase change material located on said patterned heating material and exposed surfaces of said second dielectric layer, said at least one second via is substantially aligned to said at least one first via, wherein a lower surface of the second phase change material is in direct contact with an upper surface of the patterned heating material; and providing a patterned diffusion barrier located on an exposed surface of said at least one second via.

15. The method of claim 14 further comprising providing first and second conductively filled contact vias, each of which extends through the third dielectric layer to the upper surface of the patterned heating material;

forming a third conductively filled contact via extending through the third dielectric layer and the second dielectric layer to an upper surface of the conductive material which is embedded within the first dielectric layer; and providing a patterned conductive material atop each of the conductively filled vias as well as atop the patterned diffusion barrier that is present on the second via.

16. The method of claim 14 wherein said first and second phase change materials each comprise a chalcogenide material or a chalcogenide alloy which is formed by deposition and planarization.

17. The method of claim 14 wherein said first and second phase change materials each comprise $Ge_2Sb_2Te_5$ or GeSb.

18. The method of claim 14 wherein said patterned diffusion barrier is comprised of at least one of Ta, TaN, Ti, TiN, Ru, ZrN and RuN.

19. The method of claim 14 wherein said patterned heating material is a nitride or an oxide having a resistivity of about 100 ohm cm or greater.

20. The method of claim 14 wherein said patterned heating material is $Ta_xSi_yN_z$ where x, y and z are approximately from 0 to 1, $CrO_2$ or $RuO_2$.

* * * * *